United States Patent [19]

Tam et al.

[11] Patent Number: 4,956,314

[45] Date of Patent: Sep. 11, 1990

[54] DIFFERENTIAL ETCHING OF SILICON NITRIDE

[75] Inventors: Gordon Tam, Chandler; Ronald N. Legge, Scottsdale, both of Ariz.; Wayne M. Paulson, Austin, Tex.

[73] Assignee: Motorola, Inc., Schaumburg, Ill.

[21] Appl. No.: 357,844

[22] Filed: May 30, 1989

[51] Int. Cl.$^5$ ............... H01L 21/311; H01L 21/311.5
[52] U.S. Cl. .................... 437/241; 437/985; 437/228
[58] Field of Search ............... 437/241, 985; 156/628, 156/633, 643, 653

[56] References Cited

U.S. PATENT DOCUMENTS

| 4,514,251 | 4/1985 | Van Ommen et al. | 156/628 |
| 4,654,114 | 3/1987 | Kadomura | 156/643 |
| 4,857,140 | 8/1989 | Loewenstein | 156/643 |
| 4,863,556 | 9/1989 | Reichert | 437/241 |
| 4,863,879 | 9/1989 | Kwok | 437/41 |

FOREIGN PATENT DOCUMENTS

| 0045974 | 4/1978 | Japan | 156/628 |
| 0148281 | 12/1978 | Japan | 437/241 |
| 0101428 | 6/1983 | Japan | 156/628 |
| 59-181539 | 10/1984 | Japan . | |
| 0055631 | 3/1985 | Japan | 156/628 |

OTHER PUBLICATIONS

"VLSI Fabrication Principles", Ghandhi, 1983, pp. 427–428, pp. 495–496.
"Hydrogen-Implanted Silicon Nitride", Stein; J. Electrochem. Soc., vol. 129, No. 8; pp. 1786–1791.
"Hydrogen-Implanted Silicon Nitride and Silicon Oxynitride Films"; Schalch et al., Physica Status Solidi$^a$; vol. 105; pp. K81–K86.
"IBM Technical Disclosure Bulletin"; vol. 24 No. 11B; 4/82; Kinkel et al. pp. 6094.
"Method for Etching a Silicon Nitride Film", Kinoshita et al., Japanese Kokai Patent No. 58/701428 (translation).

Primary Examiner—Brian E. Hearn
Assistant Examiner—Trung Dang
Attorney, Agent, or Firm—Harry A. Wolin

[57] ABSTRACT

A method for differentially etching silicon nitride, preferably formed in a hydrogen free environment, wherein hydrogen is implanted into various regions of the silicon nitride. The silicon nitride may then be etched by a number of different etchants, some of which will etch the implanted regions appreciably faster and others which will etch the non-implanted regions more quickly. This method is especially useful in the fabrication of self-aligned gate devices.

17 Claims, 4 Drawing Sheets

DIFFERENTIAL ETCHING OF SILICON NITRIDE

BACKGROUND OF THE INVENTION

This invention relates, in general, to the etching of silicon nitride, and more particularly to differential etching of silicon nitride employing hydrogen implants.

Typically, it has been extremely difficult to obtain a high quality differential etch of silicon nitride. Conventional masking and etching techniques generate uneven profiles having poor aspect ratios. In other words, although a differential etch may be obtained in the vertical direction, the etchant also etches horizontally under the masked regions of the silicon nitride. This causes difficulty in the fabrication of high performance electronic devices. Further, additional problems are encountered because there is generally low tolerance in stopping the etch and overetching is not uncommon.

Fabrication methods for self-aligned gate FETs have generally employed differential silicon nitride etching as disclosed above. Because of the problems associated with differential silicon nitride etching, some prior art self-aligned gate device fabrication methods employ the early formation of a metal layer which is etched to form gate metal. Further, dummy gates are commonly generated by requiring multiple dielectric-layers. This requires additional process steps.

SUMMARY OF THE INVENTION

Accordingly, it is an object of the present invention to provide a method for differentially etching silicon nitride that allows good aspect ratios in the silicon nitride to be obtained.

Another object of the present invention is to provide a method for differentially etching silicon nitride having a relatively high etch stop tolerance.

Yet a further object of the present invention is to provide a method for differentially etching silicon nitride wherein only a single dielectric layer is employed in generating a dummy gate in the process of forming a self-aligned gate device.

The foregoing and other objects and advantages are achieved in the present invention by one embodiment in which, as a part thereof, includes forming a silicon nitride layer in an essentially hydrogen-free environment, implanting hydrogen into various regions of the silicon nitride layer and employing a wet or dry etch to differentially etch the silicon nitride layer after the hydrogen has been implanted.

A more complete understanding of the present invention can be attained by considering the following detailed description in conjunction with the accompanying drawings.

DETAILED DESCRIPTION OF THE INVENTION

A method for differentially etching silicon nitride is disclosed herein. This method is especially well suited for silicon nitride that is formed by methods that do not employ hydrogen such as reactive sputtering or high temperature, low pressure CVD although the disclosed method will be somewhat successful for silicon nitride formed by methods incorporating hydrogen such as plasma assisted CVD formation.

To differentially etch a silicon nitride layer, various regions are implanted with hydrogen. Commonly, a mask is used to distinguish regions for the implant. The hydrogen is employed to generate high selectivity in the silicon nitride etch. Following the hydrogen implantation, the silicon nitride may be etched. Wet etches may be performed by using an etchant such as hydrofluoric acid (HF) which works especially well when buffered with ammonium fluoride. Phosphoric acid ($H_3PO_4$) may also be employed as a wet etchant. Phosphoric acid is most effective when heated to a temperature in the range of 150 to 170 degrees centigrade. Hydrofluoric acid will etch hydrogen implanted silicon nitride at an appreciably faster rate than it will etch non-implanted silicon nitride while phosphoric acid works oppositely and will etch non-implanted silicon nitride faster. Silicon nitride may also be dry etched using a plasma containing sulphur hexafluoride ($SF_6$) or a mixture of carbon tetrafluoride ($CF_4$) and oxygen. Both of these dry etches will etch the non-implanted silicon nitride appreciably faster than they will etch the hydrogen implanted silicon nitride.

The resultant etch generates uneven profiles in a single silicon nitride layer. This, of course, is dependent on the depth of the hydrogen implant. Excellent aspect ratios are characteristic of this etch because the hydrogen implant results in the etch proceeding appreciably faster in the vertical direction than in the horizontal direction thereby greatly reducing undercutting. This method allows for a high etch stop tolerance and works especially well in conjunction with self-aligned gate devices.

Figure 15:
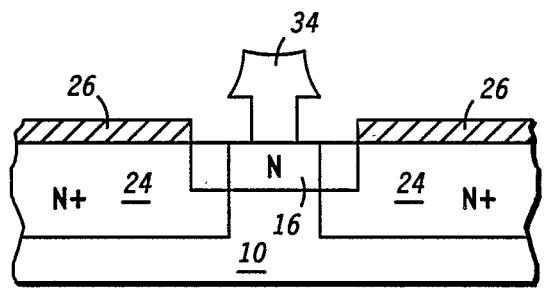
FIG. 15 illustrates a highly enlarged cross-sectional view of a portion of a self-aligned gate device.

FIGS. 1-14 are highly enlarged cross-sectional views of a portion of a self-aligned gate device during processing while FIG. 15 is the same view of the finished device. Initially, a semi-insulating gallium arsenide substrate 10 having a surface 12 is provided. Although a gallium arsenide substrate is employed in this embodiment, it should be understood that semiconductor substrates of other materials well known in the art may be employed in conjunction with the present invention. A patterned resist layer 14 is then formed on surface 12 of substrate 10 and using resist layer 14, a channel 16 is implanted. In this embodiment, channel 16 is of an n conductivity type. Once channel 16 is implanted, resist layer 14 is removed.

Figure 1:
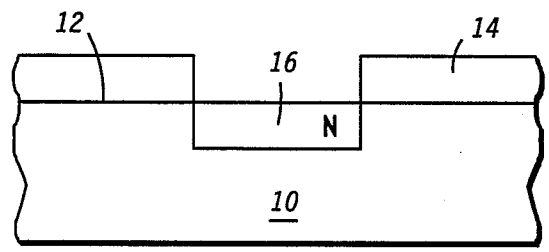
FIGS. 1-14 illustrate highly enlarged cross-sectional views of a portion of a self-aligned gate device during processing using an embodiment of the present invention.
Figure 2:
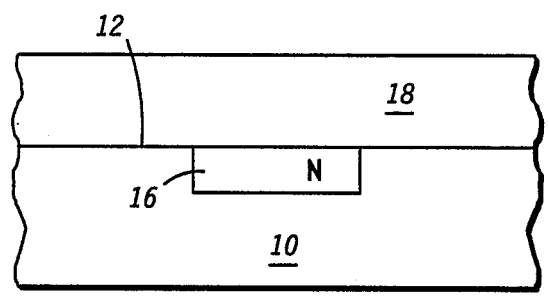
Figure 3:
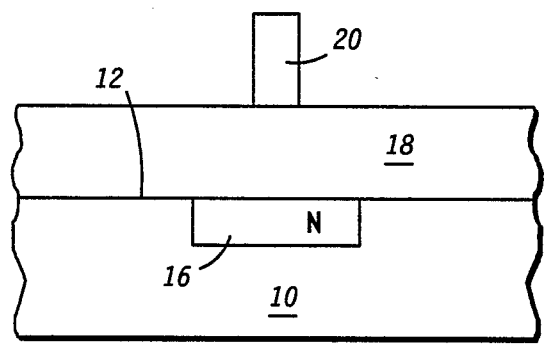
Figure 4:
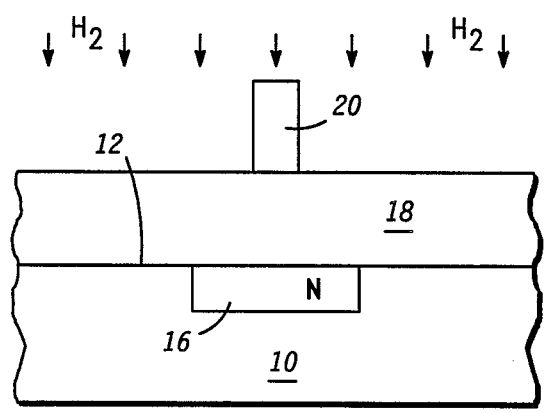
Figure 5:
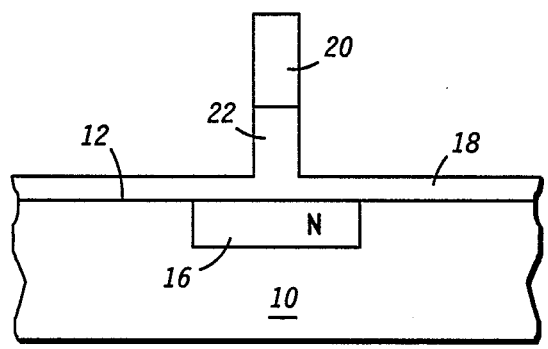

FIG. 2 depicts formation of a silicon nitride layer 18 on surface 12 of substrate 10. Silicon nitride layer 18 is generally formed in a hydrogen-free environment by a method such as reactive sputtering. A photoresist region 20 is then formed on silicon nitride layer 18 above channel 16 (FIG. 3). This is followed by the implantation of hydrogen into the regions of silicon nitride layer 18 not protected by photoresist region 20 (FIG. 4). In this embodiment, hydrogen is implanted only partially throughout the thickness of silicon nitride layer 18 which is then partially etched away using hydrofluoric acid buffered with ammonium fluoride as shown in FIG. 5. A dummy gate region 22 remains after the etch. Dummy gate region 22 is the region of silicon nitride layer 18 that was protected by photoresist region 20 and therefore, not implanted with hydrogen and not etched.

Figure 6:
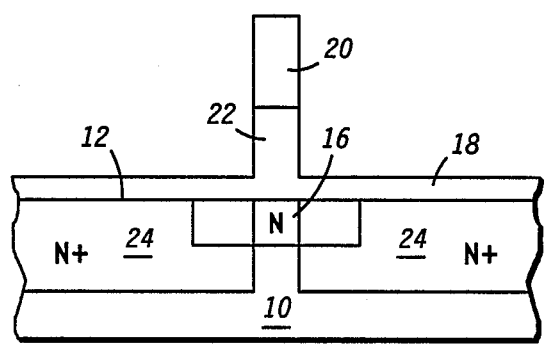
Figure 7:
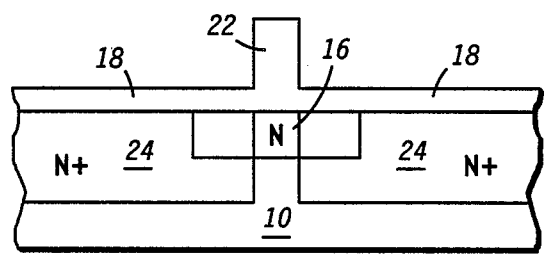
Figure 8:
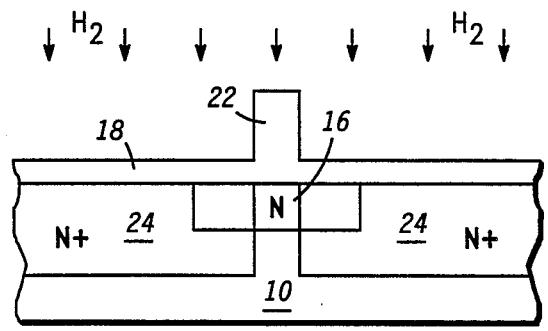
Figure 9:
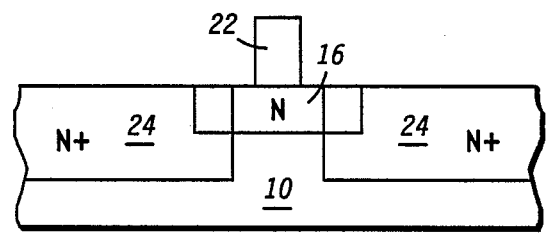

The next step, depicted by FIG. 6, shows the implantation of doped regions 24. Doped regions 24 serve as the source and drain in this embodiment and are interchangeable. Once doped regions 24 have been implanted, photoresist region 20 is removed from the top of dummy gate region 22 and the structure is then annealed (FIG. 7). A second hydrogen implant into silicon nitride layer 18 including dummy gate region 22 is then performed (FIG. 8). Following this hydrogen implant, silicon nitride layer 18 is etched away with the exception of dummy gate region 22 which is only partially etched away and remains disposed above channel 16 (FIG. 9). Again, this etch is performed using buffered hydrofluoric acid.

Figure 10:
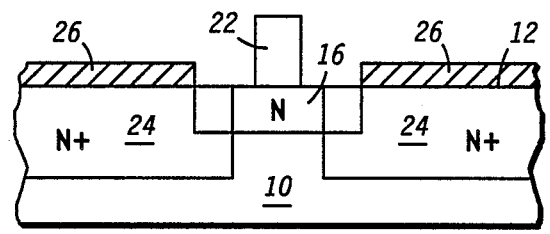
Figure 11:
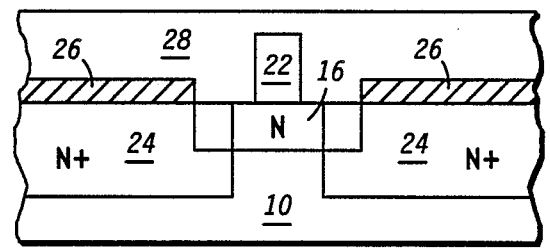
Figure 12:
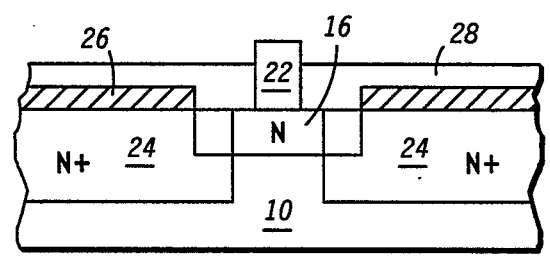
Figure 13:
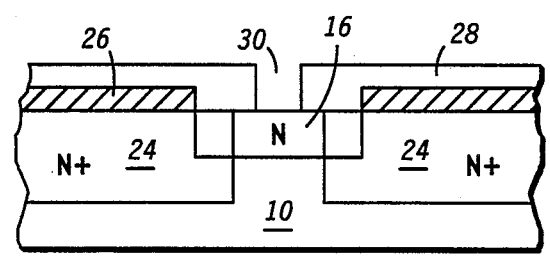
Figure 14:
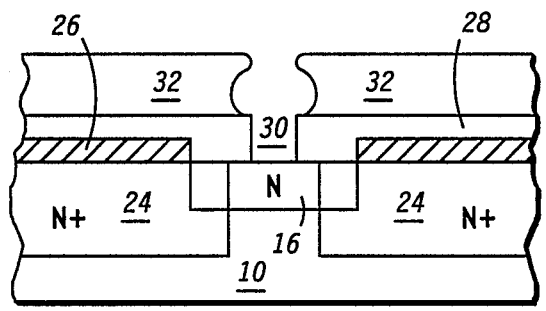

As depicted by FIG. 10, the next step is to form ohmic metal 26 on surface 12 of substrate 10 above doped regions 24. A polymer layer 28 is then formed over the entire structure as shown in FIG. 11. Polymer layer 28 is comprised of poly(dimethyl glutarimide) (PMGI). In FIG. 12, a portion of polymer layer 28 is removed by a method such as oxygen plasma planarization to expose dummy gate region 22. Dummy gate region 22 is then removed to leave an opening 30 above channel 16 as shown in FIG. 13. A resist layer 32 is then formed on polymer layer 28 leaving opening 30 exposed. Gate metal 34 is then evaporated into opening 30. This is followed by the removal of photoresist layer 32, which has been configured so that it may easily be lifted off, as well as polymer layer 28 to result in the FET depicted by FIG. 15.

Figure 16:
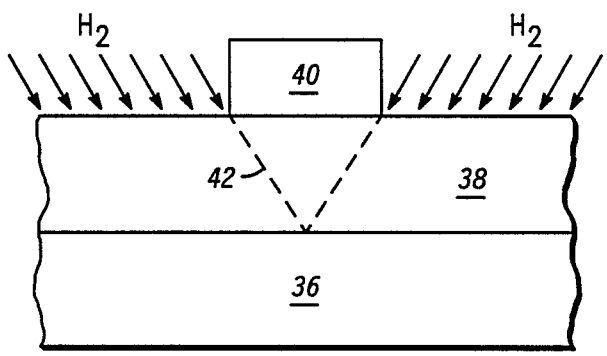
FIGS. 16-17 illustrate highly enlarged cross-sectional views of various embodiments of the present invention.
Figure 17:
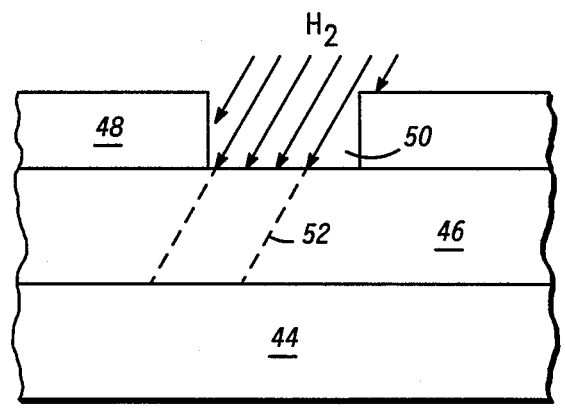

FIGS. 16–17 are highly enlarged cross-sectional views of various embodiments of the present invention. FIG. 16 includes a substrate 36 having a silicon nitride layer 38 disposed thereon. A photoresist region 40 is disposed on silicon nitride layer 38. Hydrogen is implanted into silicon nitride layer 38 at an angle shown by the arrows. This results in the hydrogen being implanted into silicon nitride layer 38 to leave a V-shaped non-implanted region depicted by dotted line 42. Now, by differentially etching silicon nitride layer 38 so that only the V-shaped portion represented by dotted line 42 remains, much smaller openings can be made by employing the V-shaped region in the same manner as dummy gate region 22 was employed in the previous embodiment. This allows scaling to become much smaller than optical photolithography parameters would allow.

Now referring to FIG. 17, a substrate 44 has a silicon nitride layer 46 disposed thereon. A photoresist layer 48 has an opening 50 through which hydrogen is implanted at an angle into silicon nitride layer 46. The implanted region is depicted by dotted lines 52. It can be seen that the region of silicon nitride layer 46 contained within dotted lines 52 can be differentially etched away leaving an opening smaller than opening 50. It should be understood that openings smaller than those obtainable by photolithographic methods may be obtained by employing hydrogen implants as disclosed above.

Thus it is apparent that there has been provided, in accordance with the invention, an improved method for differentially etching silicon nitride which meets the objects and advantages set forth above. While specific embodiments of the present invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method for differentially etching silicon nitride comprising the steps of:
   forming a silicon nitride layer in an essentially hydrogen-free environment;
   implanting hydrogen into various regions of said silicon nitride layer; and
   differentially etching said silicon nitride layer.

2. The method of claim 1 wherein the silicon nitride layer is formed by reactive sputtering.

3. The method of claim 1 wherein the silicon nitride layer is wet etched by hydrofluoric acid or phosphoric acid.

4. The method of claim 1 wherein the silicon nitride layer is dry etched by a plasma containing sulfur hexafluoride or a mixture of oxygen and carbon tetrafluoride.

5. The method of claim 1 wherein hydrogen is implanted into the silicon nitride layer at an angle.

6. The method of claim 1 wherein a FET is formed by further performing the steps of:
   providing a semiconductor substrate having a surface including a doped channel therein, the silicon nitride layer being formed on said surface of said substrate;
   forming a mask on said silicon nitride layer prior to implanting hydrogen;
   forming doped regions in said surface of said substrate before or after differentially etching said silicon nitride layer;
   removing said mask;
   forming ohmic metal above said doped regions; and
   forming gate metal above said doped channel.

7. The method of claim 6 wherein the silicon nitride layer is partially etched prior to the formation of the doped regions and the remainder of the silicon nitride layer is etched following the formation of the doped regions.

8. A method of forming a FET employing differential etching of silicon nitride comprising the steps of:
   providing a semiconductor substrate having a surface;
   forming a silicon nitride layer on said surface of said substrate, said silicon nitride layer being formed in an essentially hydrogen-free environment;
   forming a mask on said silicon nitride layer;
   implanting hydrogen into said unmasked portions of said silicon nitride layer; and
   differentially etching said silicon nitride layer.

9. The method of claim 8 wherein the silicon nitride layer is formed by reactive sputtering.

10. The method of claim 8 wherein the silicon nitride layer is wet etched by hydrofluoric or phosphoric acid.

11. The method of claim 8 wherein the silicon nitride layer is dry etched by a plasma containing sulfur hexafluoride or a mixture of oxygen and carbon tetrafluoride.

12. The method of claim 8 wherein hydrogen is implanted into the silicon nitride layer at an angle.

13. A method of forming a FET employing differential etching of silicon nitride comprising the steps of:
   providing a semiconductor substrate having a surface;
   forming a doped channel in said surface of said substrate;

forming a silicon nitride layer on said surface of said substrate, said silicon nitride layer being formed in an essentially hydrogen-free environment;

forming a photoresist region on said silicon nitride layer, said photoresist region being disposed above said doped channel;

implanting hydrogen into said silicon nitride layer excepting that disposed beneath said photoresist region;

partially etching through said hydrogen implanted silicon nitride layer;

forming doped regions in said surface of said substrate beneath said partially etched silicon nitride layer;

removing said photoresist region;

implanting hydrogen into said silicon nitride layer;

etching away said silicon nitride layer to expose said surface of said wafer excepting a portion of said silicon nitride layer disposed above said doped channel;

forming ohmic metal above said doped regions;

forming a polymer layer on said ohmic metal and said surface of said substrate leaving said portion of said silicon nitride layer exposed;

removing said portion of said silicon nitride layer to form an opening; and forming gate metal in said opening.

14. The method of claim 13 wherein the layer of silicon nitride material is formed by reactive sputtering.

15. The method of claim 13 wherein the partially etching and etching steps are performed by wet etching with hydrofluoric acid.

16. The method of claim 13 wherein the implanting hydrogen steps include implanting hydrogen into the silicon nitride layer at an angle.

17. A method for differentially etching silicon nitride comprising the steps of:

forming a silicon nitride layer in an essentially hydrogen-free environment;

implanting hydrogen into various regions of said silicon nitride layer, said hydrogen being implanted at an angle; and differentially etching said silicon nitride layer.

* * * * *